(12) United States Patent
Karlquist

(10) Patent No.: US 8,933,706 B1
(45) Date of Patent: Jan. 13, 2015

(54) APPARATUS FOR MEASURING FREQUENCY CHANGE OF AN OSCILLATOR

(75) Inventor: Richard K. Karlquist, Galt, CA (US)

(73) Assignee: Keysight Technologioes, Inc., Santa Rosa, CA (US)

( * ) Notice: Subject to any disclaimer, the term of this patent is extended or adjusted under 35 U.S.C. 154(b) by 282 days.

(21) Appl. No.: 13/405,581

(22) Filed: Feb. 27, 2012

(51) Int. Cl.
*G01R 27/04* (2006.01)

(52) U.S. Cl.
USPC .......................................................... 324/633

(58) Field of Classification Search
USPC .......... 324/633, 636, 600, 652, 675, 668, 682
See application file for complete search history.

(56) References Cited

U.S. PATENT DOCUMENTS

| | | | |
|---|---|---|---|
| 4,531,843 A | 7/1985 | Kuhnlein et al. | |
| 6,193,413 B1 | 2/2001 | Lieberman | |
| 2003/0052740 A1* | 3/2003 | Salmi et al. | 331/100 |
| 2007/0054629 A1* | 3/2007 | Maligeorgos et al. | 455/88 |
| 2011/0228809 A1 | 9/2011 | Tadigadapa | |

* cited by examiner

*Primary Examiner* — Melissa Koval
*Assistant Examiner* — Trung Nguyen

(57) ABSTRACT

An apparatus comprises: a first oscillator; a second oscillator; a first frequency synthesizer configured to receive a first input from the first oscillator and to provide a scaled first output frequency based on the first input; a second frequency synthesizer configured to receive a second input from the second oscillator and to provide a scaled second output frequency based on the second input; a mixer configured to receive the scaled first output frequency and the scaled second output frequency and to output a difference between the scaled first output frequency and the scaled second output frequency; and a processor configured to determine a change in an output frequency of the first oscillator based on the difference. The change in the output frequency provides an indication of a change in a measurement parameter.

12 Claims, 4 Drawing Sheets

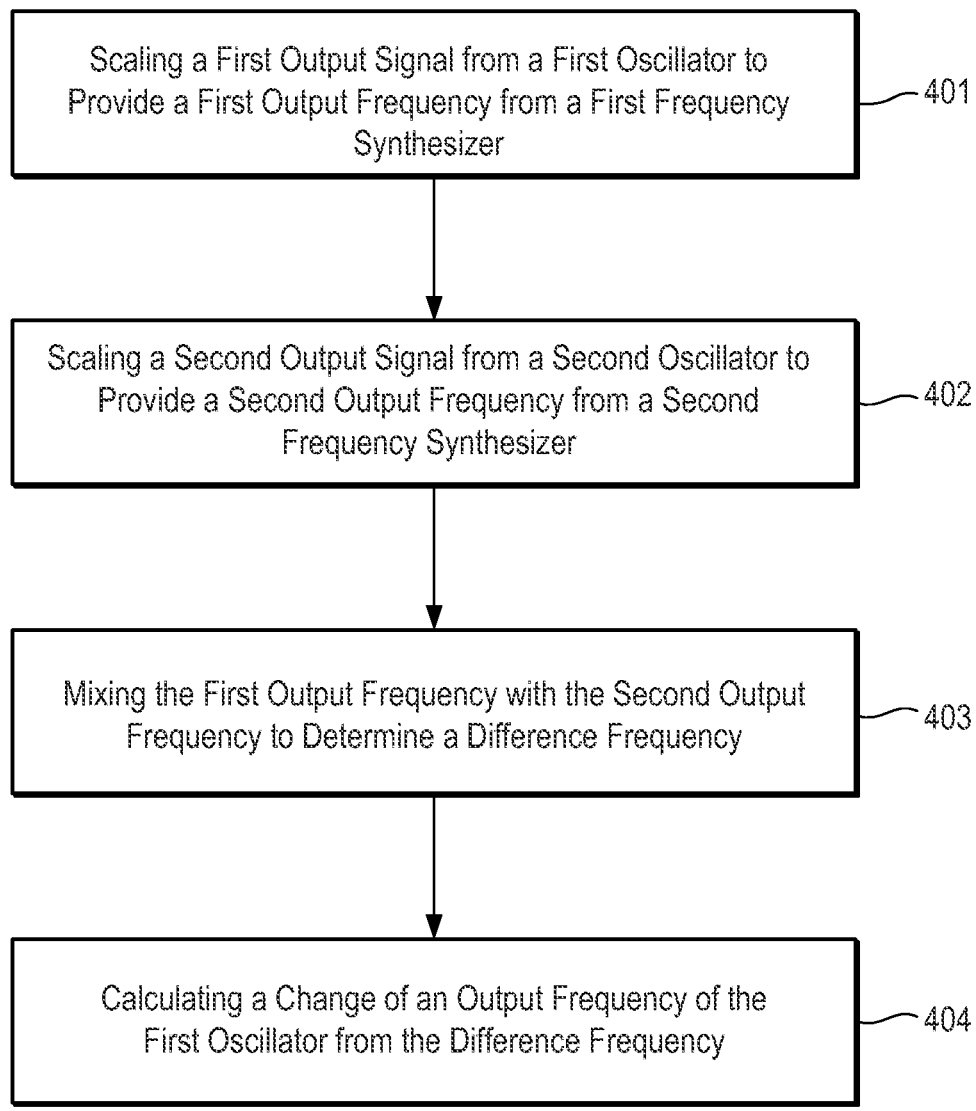

US 8,933,706 B1

APPARATUS FOR MEASURING FREQUENCY CHANGE OF AN OSCILLATOR

BACKGROUND

Oscillators comprise a resonator having a resonant frequency that can change due to environmental factors, such as temperature and contaminants that deposit on the surface of the resonator. The ability to measure changes in the resonant frequency of the resonator allows for many types of measurements to be made. Illustratively, changes in the resonant frequency due to the presence of a harmful contaminant in the ambient, or changes in the resonant frequency due to changes in temperature, can be the basis of a device for detecting harmful contaminants, or the basis of a thermometer.

Thermometers can measure changes in temperature at a particular location through measurements of changes in a resonant frequency of the resonator of the oscillator. In a typical thermometer, a first resonator is a component of a first oscillator and a second resonator is a component of second oscillator. The first resonator ("measurement resonator") is disposed adjacent to an object or element under measurement, and the second resonator ("reference resonator") is disposed far enough away from the measurement site that changes in the temperature of the object do not impact its resonant frequency. In order to account for common mode heating effects from the ambient, the resonant frequency of the reference resonator is measured at the same times as the measurement resonator, and is subtracted from the frequency of the reaction resonator.

Thermometers are used, for example, to measure a change in temperature caused by a chemical reaction of a sample. Because of the temperature dependence of the resonator of the oscillator, a change in temperature causes a change in the resonant frequency of the reaction resonator. As such, the thermometer tracks the frequency of the oscillator versus time during the reaction, and the change in temperature of the measurement site is determined based on previous characterization of the change in resonant frequency versus temperature.

Typically in thermometers, determination of the temperature over time involves placement of a large number of pairs (measurement and reference) of oscillators near respective reaction sites. Each oscillator generates a unique frequency, and each frequency output from each oscillator is transported away from the thermometer array (e.g., on coaxial cables) to a large number (e.g., hundreds) of remote frequency counters. The subtraction of the reference frequency from the reaction frequency is then made and the difference between the reaction temperature and the reference temperature is determined algorithmically, for example, in a processor.

Unfortunately, a thermometer incorporating such a large number of frequency counters is not only complex, but also comparatively expensive. Furthermore, the accuracy of such a thermometer can be diminished due to thermal leaks that can occur between the oscillators and their respective frequency counters. Additionally, such an implementation is susceptible to inaccuracies due to cross-talk between oscillators.

What is needed, therefore, is an apparatus and a method for measuring a change in the frequency of an oscillator that overcomes at least the shortcomings of known apparatuses such as those described above.

SUMMARY

In accordance with a representative embodiment, a method comprises: scaling a first output signal from a first oscillator to provide a first output frequency from a first frequency synthesizer; scaling a second output signal from a second oscillator to provide a second output frequency from a second frequency synthesizer; mixing the first output frequency with the second output frequency to determine a difference frequency; and determining a change of an output frequency of the first oscillator from the difference frequency to provide an indication of a change of a measurement parameter.

In accordance with another representative embodiment, an apparatus comprises: a first oscillator; a second oscillator, a first frequency synthesizer configured to receive a first input from the first oscillator and to provide a scaled first output frequency based on the first input; a second frequency synthesizer configured to receive a second input from the second oscillator and to provide a scaled second output frequency based on the second input; a mixer configured to receive the scaled first output frequency and the scaled second output frequency and to output a difference between the scaled first output frequency and the scaled second output frequency; and a processor configured to determine a change in an output frequency of the first oscillator based on the difference. The change in the output frequency provides an indication of a change in a measurement parameter.

In accordance with yet another representative embodiment, a calorimeter comprises: a first substrate comprising a reaction site; a second substrate comprising a first resonator and a second resonator, wherein the first resonator is adjacent to the reaction site; a first oscillator including the first resonator and a second oscillator including the second oscillator; a first frequency synthesizer configured to receive a first input from the first oscillator and to provide a scaled first output frequency based on the first input; a second frequency synthesizer configured to receive a second input from the second oscillator and to provide a scaled second output frequency based on the second input; a mixer configured to receive the scaled first output frequency and the scaled second output frequency and to output a difference between the scaled first output frequency and the scaled second output frequency; and a processor configured to determine a change in an output frequency of the first oscillator based on the difference.

BRIEF DESCRIPTION OF THE DRAWINGS

The described embodiments are best understood from the following detailed description when read with the accompanying drawing figures. Wherever applicable and practical, like reference numerals refer to like elements.

FIG. 4 is a flowchart illustrating a method of measuring a change in resonant frequency of an oscillator according to a representative embodiment.

DETAILED DESCRIPTION

Figure 1:
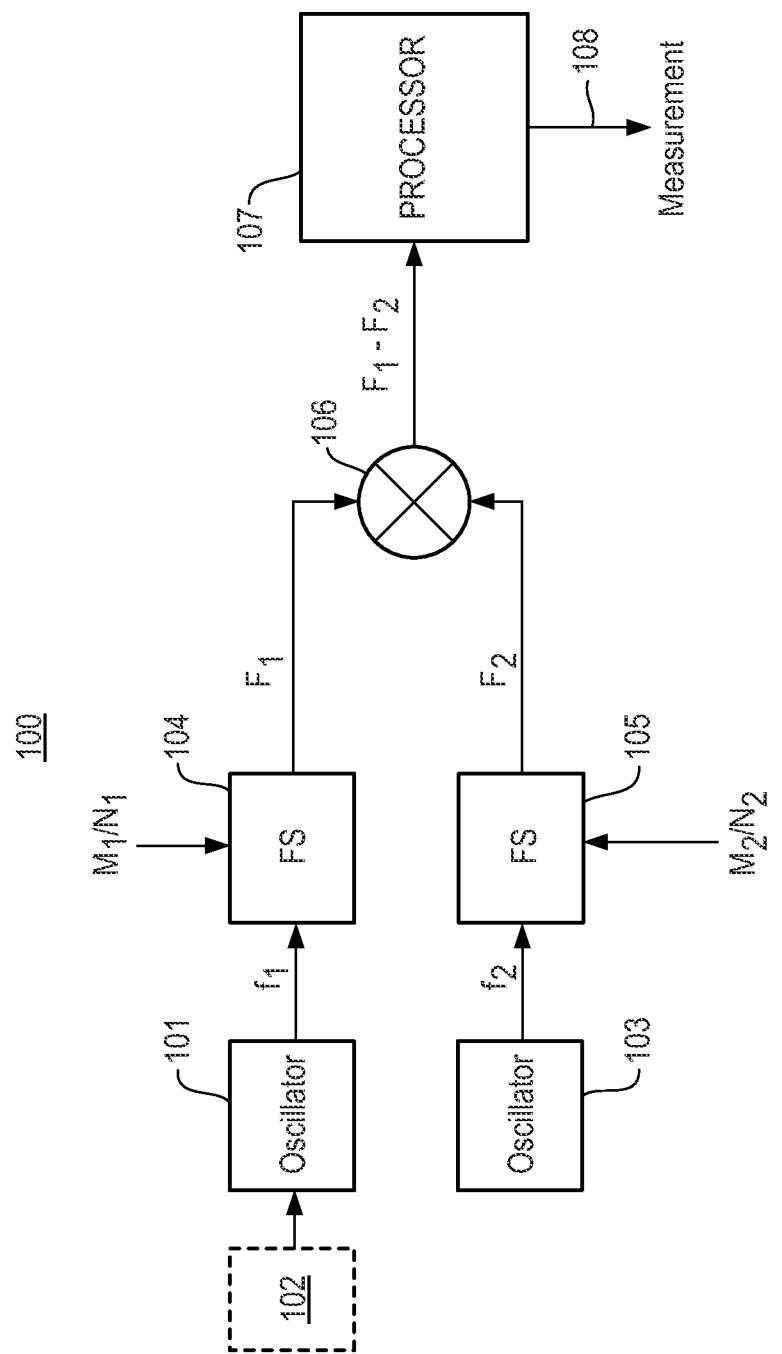
FIG. 1 is a simplified block diagram of an apparatus for measuring the change in resonant frequency of an oscillator according to a representative embodiment.

In the following description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claim set. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Unless otherwise specifically noted, when a first device is said to be connected or coupled to a second device, this encompasses cases where one or more intermediate devices may be employed in the connection of the two devices to each other. In contrast, when a first device is said to be directly connected or directly coupled to a second device, this encompasses cases where the two devices are connected together without any intervening devices except any necessary electrical conductors (e.g., circuit traces or wires).

The described embodiments relate generally to measurement of changes in the resonant frequency of a resonator of an oscillator over time. The changes in the resonant frequency of the resonator can be used to provide an indication of a change in a measurement parameter in a variety of types of measurements. Measurement parameters contemplated by the present teachings include, but are not limited to, changes in temperature and changes in mass of a substance. As described more fully below, the changes in measurement parameters are based on changes in the resonant frequency of a resonator over time. For example, measurements over time of the change in resonant frequency of a resonator of an oscillator can be used to accurately measure changes in temperature of the resonator over time. These measurements of changes in temperature over time can be used to provide a calorimeter, a pyrometer, a thermometer or an infrared (IR) energy detector. In one illustrative application, the change in temperature due to a chemical reaction can be measured many times per second to provide useful thermal information of the reaction taking place. In another illustrative application, the change in temperature due to radiation incident on a resonator of an oscillator can be measured over time (e.g., many measurements per second). A plurality of such resonators can be arranged to form an IR imaging device with each resonator forming a picture element (pixel) or a portion of a pixel of the imaging device.

In another useful application, the change in the resonant frequency of a resonator of an oscillator can result from a change in mass of a substance on the resonator caused by the deposition of the substance (e.g., contaminant) on the surface of the resonator. The change in resonant frequency over time can be measured to provide an accurate measure of the rate of deposition of the substance and the overall change in concentration of the substance in the ambient. Applications of the present teachings are contemplated for detection of a variety of substances, for example contaminants in a clean room that can compromise the quality of a device (e.g., semiconductor device) being fabricated in the clean room.

As described below in accordance with representative embodiments, frequency synthesizers drive a frequency mixer that produces the beat note. By synthesizing frequencies at a comparatively high frequency (e.g., in the range of 2 GHz to 4 GHz), it is possible to get even more leverage with respect to the low beat note frequency. Beneficially, it is only necessary to measure the beat note derived from the comparatively high frequency (e.g., 2 GHz) to an accuracy orders of magnitude less (e.g. 0.2 Hz to 2 Hz in this example), in order to determine the difference frequency between resonators having a resonant frequency of approximately 100 MHz (in the present example) to within 0.01 to 0.1 Hz. The comparatively high frequency signal (e.g., 2 GHz) provided by the frequency synthesizers tracks the lower resonant frequency (e.g., 100 MHz) signal very well because the phase locked loop bandwidth is large relative to the bandwidth of the frequency modulation caused by the combination of the intrinsic frequency noise and the extrinsic frequency modulation caused by fluctuations in temperature (or other measurement parameter) by the experiment being measured.

FIG. 1 is a simplified block diagram of an apparatus 100 for measuring the change in resonant frequency of an oscillator according to a representative embodiment. The apparatus 100 comprises a first oscillator 101 that is disposed adjacent to a measurement site 102. The first oscillator 101 comprises a first resonator (not shown in FIG. 1) having a resonant frequency that changes in response to changes to the sample.

For purposes of illustration of the potential applications of the apparatus 100, changes in temperature of the measurement site 102 resulting in changes in the resonant frequency of the first oscillator 101 are described. The changes in the resonant frequency of the first oscillator 101 due to changes in the temperature of the measurement site 102 are measured using the apparatus 100 and, changes in the temperature of the measurement site 102 are then determined. The changes in the resonant frequency that depends in a known way on temperature, such as described in U.S. Pat. No. 6,193,413 to Lieberman, the disclosure of which is specifically incorporated herein by reference. As such, the apparatus 100 may be used to determine the temperature change versus time of the measurement site 102. Illustratively, the measurement site 102 may be a site where a chemical reaction occurs. Alternatively, IR radiation may be incident on the measurement site 102, and changes in the temperature of the measurement site 102 can be determined by determination of changes in the resonant frequency. An array of such measurement sites 102 could thereby form the basis of an IR detector or imaging device. It is emphasized that these applications are merely illustrative, and that other measurements based on changes in the resonant frequency of the first resonator are contemplated.

The apparatus 100 comprises a second oscillator 103 that is used as a reference oscillator or standard oscillator for relative measure against the first oscillator 101. The apparatus 100 comprises a first frequency synthesizer 104, which receives as one input the output from the first oscillator 101 (at frequency $f_1$), and a second frequency synthesizer 105, which receives as one input the output of the second oscillator 103 (at frequency $f_2$). The first frequency synthesizer 104 scales the output from the first oscillator 101 by a first rational ratio $(M_1/N_1)$ and provides a scaled first output frequency $F_1$. Similarly, the second frequency synthesizer 105 scales the output from the second oscillator 103 by a second rational ratio ($M_2/N_2$) and provides a scaled second output frequency $F_2$. The scale factors ($M_1/N_1$, $M_2/N_2$) are determined algorithmically by a processor (e.g., processor 107) or stored in a look-up table in memory (not shown) so that in an initial calibration, the output frequencies from the first and second frequency synthesizers 104, 105 are fixed to desired values. As described more fully below, compared to the outputs ($f_1$, $f_2$) from the first and second oscillators 101, 103, the scaled first and second output frequencies $F_1$, $F_2$ each are a higher frequency.

The scaled first output frequency $F_1$ and the scaled second frequency output $F_2$ are provided as respective inputs to the mixer 106, and an output frequency $F_1$-$F_2$ is provided to the processor 107. For reasons described more fully below, the difference between the first and second output frequencies $F_1$, $F_2$ is small compared to their respective magnitudes.

The frequency outputs of the first oscillator 101 ($f_1$) and the second oscillator 103 ($f_2$) are known initially, but are not readily controlled. However, the first and second frequency synthesizers 104, 105 are configured to provide comparatively consistent scaled first and second output frequencies ($F_1$, $F_2$) that differ by a preselected amount. As described more fully herein, variations in the difference frequency from the mixer 106 usefully allows the determination of a change in the resonant frequency of the first oscillator 101. The processor 107 is thereby configured to determine a particular change in a measurement parameter based on the change of the resonant frequency.

In representative embodiments, the first and second oscillators comprise resonators (not shown in FIG. 1), which resonate at a particular resonant frequency at an initial set of conditions. The resonant frequency of the resonators changes due to changes in environmental conditions such as temperature or accumulation of a substance on respective surfaces thereof. Contemplated substances include, but are not limited to, contaminant particles and moisture. The changes in the resonant frequency are used to determine a change in a measurement parameter, as described more fully in connection with representative embodiments herein. Illustratively, contemplated resonators include, but are not limited to crystal (e.g., quartz) resonators and piezoelectric resonators. Piezoelectric resonators contemplated for use as the resonators of the presently described embodiments include but are not limited to bulk acoustic wave (BAW) resonators including film bulk acoustic resonators (FBARs) and surface mount resonators (SMRs). Furthermore, surface acoustic wave (SAW) resonators are also contemplated for use in accordance with the present teachings.

The first and second oscillators 101, 103 may each be one of a variety of oscillators within the purview of one of ordinary skill in the art. By way of example only, Colpitts oscillators are contemplated for use as first oscillator 101, or second oscillator 103, or both.

The first and second frequency synthesizers 104, 105 are commercially available, and may be so-called frequency synthesizers "on a chip" such as, for example Analog Devices ADF4350 from Analog Devices, Norwood, Mass. USA or similar device. As described more fully below, in a representative embodiment, the first and second frequency synthesizers 104, 105 are configured to generate a difference frequency ($F_1$-$F_2$) in the audio frequency range. Because the first and second frequency synthesizers 104, 105 are integrated circuits (ICs), they can be located in rather close proximity to the first and second oscillators 101, 103. Beneficially, the audio difference frequency provided by the mixer 106 is thereby provided at a safe distance from the first and second oscillators 101, 103 and to the processor 107 where determinations of measurement parameters can occur.

The processor 107 or controller may be one of a variety of known processors configured for use in connection with the present teachings. The processor may be an application specific integrated circuits (ASIC), field-programmable gate array (FPGA), or combinations thereof, using software, firmware, hard-wired logic circuits, or combinations thereof.

The processor 107 includes or is connected to a memory (not shown) included for storing executable software/firmware and/or executable code that enables performance of the various functions of the apparatus 100. Among other functions, the processor 107 is configured to set the scale factors ($M_1/N_1$, $M_2/N_2$) of the first and second frequency synthesizers 104, 105 in order to set the first and second output frequencies ($F_1$, $F_2$) to desired levels. The processor 107 is also configured to determine a change in the resonant frequency of the resonator of the first oscillator 101 based on the output from the mixer 106, and to determine a change in a particular measurement parameter based on the change of the resonant frequency.

The memory may be any number, type and combination of nonvolatile read only memory (ROM) and volatile random access memory (RAM), and may store various types of information, such as computer programs and software algorithms executable by the processor or CPU. The memory may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like.

Figure 2:
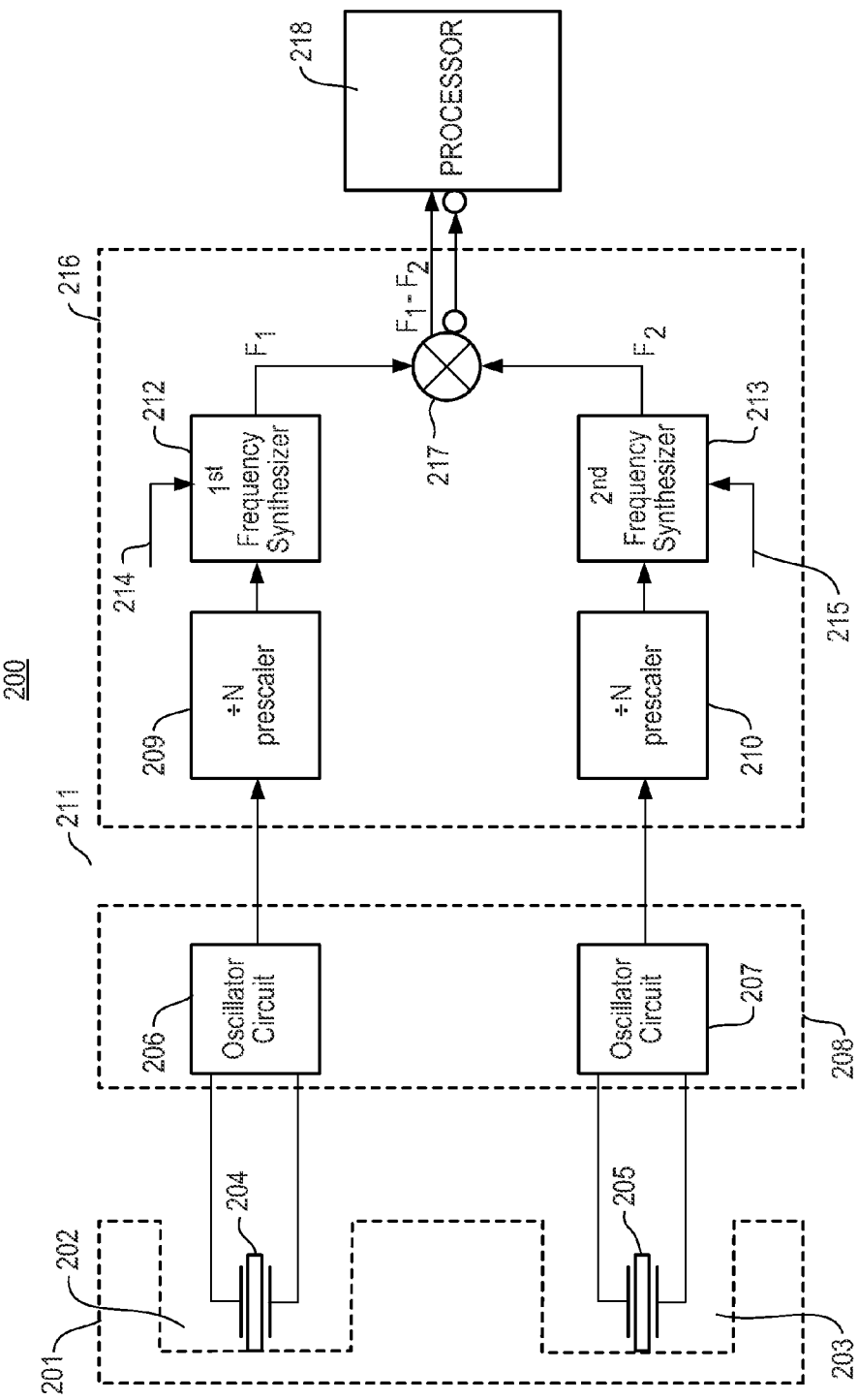
FIG. 2 is a simplified block diagram of a thermometer according to a representative embodiment.

As noted above, there are various applications of the apparatus 100 to determine measurement parameters such as change in temperature or change in contaminant concentration. FIG. 2 is a simplified block diagram of a thermometer 200 according to a representative embodiment. Certain details of the various components of the apparatus 100 described above are common to corresponding components of the thermometer 200. Often, these common details are not repeated so as to avoid obscuring the description of the present embodiments.

The thermometer 200 comprises first substrate 201, which includes a measurement site 202 and a reference site 203. Changes in temperature at the measurement site 202 are determined in accordance with the teachings of the presently described representative embodiment. Notably, the measurement site 202 may be a reaction site for a chemical reaction, in which case the thermometer functions as a calorimeter. Alternatively, IR radiation may be incident on the measurement site 202 resulting in a change in the temperature at the measurement site. In such an application, the thermometer 200 functions as an IR detector, and a plurality of measurement sites 202 could be provided (each with a corresponding reference site 203) to provide an IR imaging device. It is emphasized that the applications of the thermometer 200 are merely illustrative, and other applications within the purview of one of ordinary skill in the art, having had the benefit of this disclosure, are contemplated.

A first resonator 204 is disposed adjacent to the measurement site 202, and a second resonator 205 is disposed adjacent to the reference site 203. As noted above, the respective resonant frequencies of the first and second resonators 204, 205 depend on temperature in a known way, and the changes in the resonant frequency of the first resonator 204 due to changes in the temperature at the measurement site 202 are determined using the thermometer 200 in a manner described below. The first resonator 204 is connected to a first oscillator circuit 206, and the second resonator 205 is connected to a second oscillator circuit 207. Optionally, the first and second oscillator circuits 206, 207 are provided over an oscillator substrate 208, such as a circuit board selected for use in the thermometer 200. Illustratively, the oscillator substrate 208 comprises a known printed circuit board material (e.g., FR-4) or other material found suitable for use as the oscillator substrate 208 by one of ordinary skill in the art, who has had the benefit of the present disclosure.

In the representative embodiment, the first and second resonators 204, 205 have resonant frequencies on the order of a hundred ($10^2$) MHz. So, the output from the first and second oscillator circuits 206, 207 are on the order of $10^2$ MHz. For purposes of illustration of a representative application, the first resonator 204 is selected to have a change in frequency versus temperature on the order of $10^{-2}$ ppm/$10^{-3}$° C. So, continuing with the present illustration, a change of $10^{-3}$° C. of the first resonator 204 will result in a change in the output frequency of the first resonator 204 of $10^{-2}$ Hz. More generally, the first resonator 204 is selected to have a sensitivity to temperature on the order of 10 ppm/K to 100 ppm/K. As such, the first oscillator circuit 206 has similar sensitivity to temperature.

The output of the first oscillator circuit 206 is provided to an (optional) first prescaler 209, and the output of the second oscillator circuit 207 is provided to an (optional) second prescaler 210. Notably, the first and second prescalers 209, 210 are provided to overcome limitations on the input frequencies to the frequency synthesizers and are not needed if such limitations do not exist. An optional thermal barrier 211 is provided adjacent to the oscillator substrate 208 to prevent inaccuracies due to thermal transfer.

The first prescaler 209 provides an input to a first frequency synthesizer (FS) 212 and the second prescaler 210 provides an input to a second FS 213. A first scale input 214 is provided to the first FS 212 and a second scale input 215 is provided to the second FS 213. The first FS 212, the second 213 and the first and second prescalers 209, 210 are provided over a suitable substrate 216, such as a known printed circuit board.

The first scale input 214 causes the first FS 212 to scale the output frequency of the first oscillator circuit 206 by a first rational ratio ($M_1/N_1$) and provides a scaled first output frequency $F_1$. Similarly, the second scale input 215 causes the second FS 213 to scale the output frequency of the second oscillator circuit 207 by a second rational ratio ($M_2/N_2$) and provides a scaled second output frequency $F_2$. The respective output signals from the first FS 212 and the second FS 213 are provided to a mixer 217. The difference frequency of the output from the mixer 217 is provided to a processor 218, where determinations of the change in the resonant frequency of the first resonator 204 are made.

The second frequency synthesizer 105 scales the output from the second oscillator 103 by a second rational ratio ($M_2/N_2$) and provides a scaled second output frequency $F_2$. The scale factors ($M_1/N_1$, $M_2/N_2$) are determined algorithmically by the processor 218 or are stored in a look-up table in memory (not shown) so that in an initial calibration, the output frequencies from the first and second frequency synthesizers 104, 105 are fixed to desired values.

The scale factors ($M_1/N_1$, $M_2/N_2$) are selected so that the difference between the output frequency of the first FS 212 and the output frequency of the second FS 213 is fixed to a known value at initial calibration, and so the magnitude of the difference between the output frequency of the first FS 212 and the output frequency of the second FS 213 is small compared to the magnitude of the output frequencies of the first and second frequency synthesizers 212, 213. Continuing with the quantitative illustration, with the resonant frequencies of first and second resonators 204, 205 on the order of 102 MHz, the scale factors ($M_1/N_1$, $M_2/N_2$) are approximately 10, the scaled first output frequency $F_1$ and the scaled second output frequency $F_2$ are each on the order of one GHz ($10^9$), and the difference between the output frequency of the first FS 212 and the output frequency of the second FS 213 ("difference frequency") is on the order of 10 Hz. More generally, the difference frequency between the output frequency of the first FS 212 and the output frequency of the second FS 213 is at least four orders of magnitude less than the scaled first frequency $F_1$ and the scaled second frequency $F_2$.

The selection of the ratio of mixer input frequencies ($F_1$, $F_2$) to output frequencies ($F_1$-$F_2$) (and thus the selection of $M_1/N_1$, $M_2/N_2$) requires consideration of certain tradeoffs. Increasing the ratio allows for the measurement of smaller frequency changes of the first and second resonators 204, 205. Increasing the ratio can be done either by increasing the first and second output frequencies $F_1$, $F_2$ or decreasing the difference frequency. Increasing the first and second output frequencies $F_1$, $F_2$ provided to the mixer 217 has certain drawbacks such as an increase in the overall complexity, cost, size and power consumption of the apparatus 200.

Decreasing the difference frequency reduces the rate at which the measurement parameter is updated. Notably, the average beat note frequency from the output of the mixer 217 must be great enough so that fluctuations in the output of the first and second oscillator circuits 206, 207 due to either intrinsic frequency noise or external disturbances from the parameter being measured are such that the required update rate is not violated. Stated somewhat differently, the average beat note frequency from the mixer 217 must be high enough so that fluctuations at the first and second oscillator circuits 206, 207 due to either intrinsic frequency noise or other sources of noise do not significantly impact the beat note frequency.

Following the example above, if the first and second output frequencies $F_1$, $F_2$ are on the order of 1 GHZ, and the temperature changes being measured are a maximum of 1 millidegree, then the input frequencies will change $10^{-2}$ ppm, or about 10 Hz. If a minimum beat note of 10 Hz is required to allow 10 updates per second, the beat note would be set nominally at 20 Hz, so that if it decreased 10 Hz, it would still meet the 10 Hz minimum.

In addition to the considerations regarding the difference frequency discussed above, it is also important that the beat note frequency does not cross zero to avoid ambiguity in the measurement parameter. As such, it is important that the difference frequency be great enough that the beat note frequency does not cross through zero.

The difference frequency output from the mixer 217 cannot be on the same order of magnitude of the uncertainty or drift in the first and second resonators 204, 205. To this end, as described above, the output of either the first FS 212 or the second FS 213 is selected to provide a higher output frequency output than the other (e.g., $F_1$>$F_2$). Once this is determined, the output frequency of the "higher" frequency synthesizer should not vary to the point that it is "lower" than the output frequency of the other frequency synthesizer. Stated somewhat differently, if the difference frequency provided by the mixer 217 were on the same order of magnitude as the frequency drift or uncertainty of the frequency of the first and second resonators 204, 205, it may be difficult to determine with certainty which of the first FS 212 or second FS 213 had the higher frequency at any particular time. Of course, such uncertainty can result in inaccuracy in determining the change in the resonance frequency by determination of the period of the output from the mixer 217.

The present teachings also contemplate having first FS 212 and second FS 213 tune over an octave frequency range. This allows for a greater choice of the difference frequency compared to having one frequency synthesizer providing an output frequency of, for example, 2 GHz, and tuning the other frequency synthesizer to be "near" this frequency as described above The scaling of the output signals from the first and second oscillator circuits 206, 207 by the first FS 212 and the second FS 213 provides a proportional change in the scaled first output frequency $F_1$ and the scaled second output frequency $F_2$. So, if there is a change in the output frequency of the first oscillator circuit 206 because of a change in the resonant frequency of the first resonator 204, the change in the scaled first output frequency $F_1$ is proportional. Beneficially, because of this scaling by the first FS 212 and the second FS 213, and the comparatively small difference between the scaled first frequency $F_1$ and the scaled second frequency $F_2$, a small change (e.g., $10^{-3}$° C. or less) in the temperature at the measurement site 202 can be measured by the thermometer through the measurement of a change in the difference frequency on the order of $10^{-1}$ Hz of a signal having a frequency (the difference frequency) on the order of $10^1$ Hz.

As described above, the present teaching "leverages" the scaling of the resonant frequencies of the first oscillator circuit 206 and the second oscillator circuit 207. This leveraging affect allows for measurements of very small changes in the resonant frequency of the first and second resonators 204, 205 to be determined with through the determination of changes of the difference frequency (from the mixer 217) requiring much less precision. Continuing with the quantitative example set forth above, the output frequencies of the first and second oscillator circuits are on the order of $10^2$ MHz. These output frequencies are scaled by a factor of 10, and mixed to provide a difference frequency from the mixer 217 on the order of $10^{-1}$ Hz. A change in the resonant frequency of the first resonator 204 on the order of $10^{-2}$ Hz can be measured through the measurement of a change in the difference frequency on the order of $10^{-1}$ Hz, where the difference frequency is on the order of $10^1$ Hz. Accordingly, from the present example, it can be appreciated that through implementation of the present teachings, in one application, a change in the temperature at the measurement site 202 on the order often millionths of a degree Celsius can be determined with processor 218 by determination of a change of one-tenth Hz in the difference frequency, which is on the order of 10 Hz. Processing power for such a determination is readily available.

Figure 3:
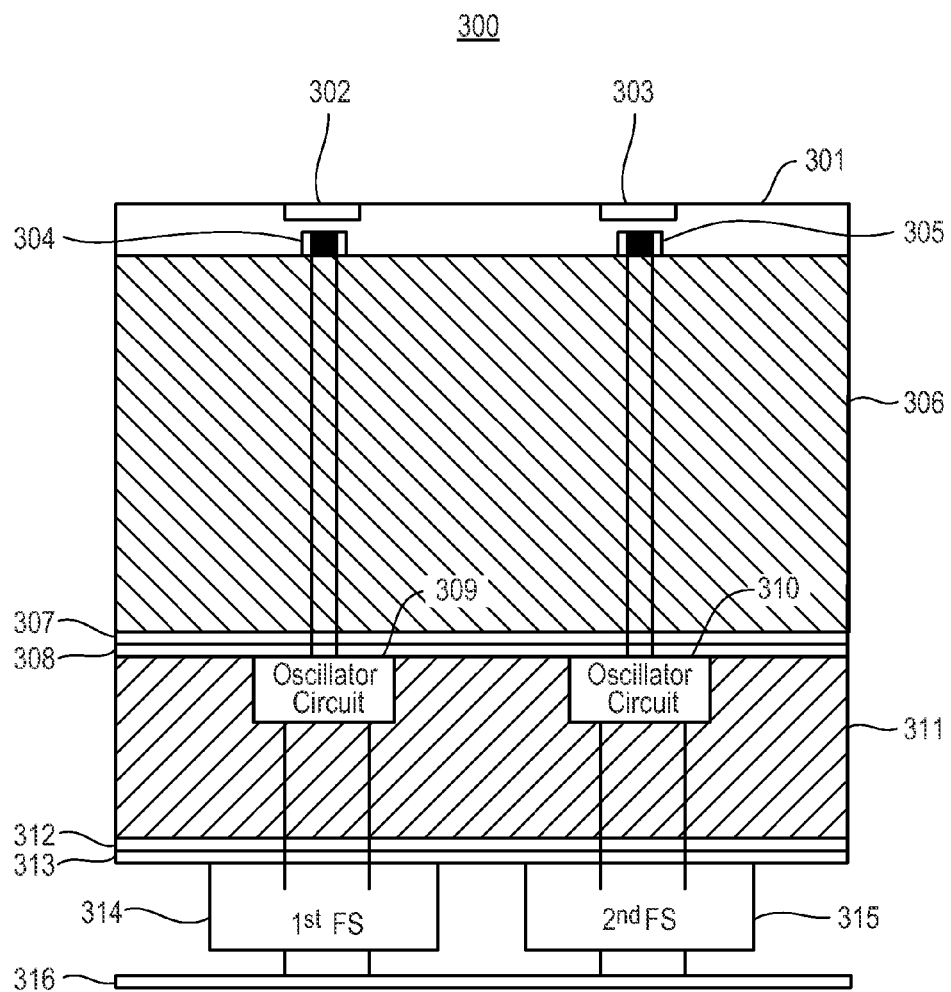
FIG. 3 is a simplified cross-sectional view of an apparatus configured to determine a change in a temperature according to a representative embodiment.

FIG. 3 is a simplified cross-sectional view of an apparatus 300 configured to determine a change in a temperature according to a representative embodiment. In one representative embodiment, the apparatus 300 is configured to determine a change in temperature caused by a chemical reaction, while in another representative embodiment, the apparatus 300 is configured to measure a change in temperature due to incident IR signals. It is noted that a plurality of similarly disposed components of the apparatus 300 can be provided to form a large scale calorimeter or to form an IR detector or IR imaging apparatus. Certain details of the various components of the apparatus 100 and the thermometer 200 described above are common to corresponding components of the apparatus 300. Often, these common details are not repeated so as to avoid obscuring the description of the present embodiments.

The apparatus 300 comprises a first substrate 301 comprising a measurement site 302 and a reference site 303. A measurement resonator 304 and a reference resonator 305 are provided over a second substrate 306, and beneath the measurement site 302 and the reference site 303, respectively.

The measurement site 302 and the reference site 303 may be wells or cavities formed in the first substrate 301, which is illustratively a semiconductor or other suitable material within the purview of one of ordinary skill in the art and selected for the desired application of the apparatus 300.

In one embodiment, the measurement site 302 is a reaction site for a chemical reaction, while in another embodiment the measurement site is an IR detection site or picture element (pixel) for an IR detector or imaging device. As such, in such an application of the present teachings the material selected for the first substrate 301 as well as the proximity of the measurement resonator 304 to the measurement site 302, and the proximity of the reference resonator 305 to the reference site 303 are selected to foster thermal coupling between the respective resonators 304, 305 and sites 302, 303. By contrast the material and dimensions of the second substrate 306 are selected to provide a thermal barrier between the measurement and reference resonators 304, 305 and other components of the apparatus 300.

An optional first backing plate 307 is disposed beneath the second substrate 306 and between the second substrate 306 and a first circuit board 308 configured to support and provide electrical connection to a first oscillator circuit 309 and a second oscillator circuit 310. The first backing plate 307 illustratively comprises aluminum.

A thermally insulating material 311 (e.g., foam polystyrene or other suitable foam material) is provided between the first and second oscillator circuits 309, 310, and an optional second backing plate 312. A second circuit board 313 is provided beneath the second backing plate 312. First FS 314 and second FS 315 and the mixer (not shown in FIG. 3) are disposed over the second circuit board 313, which provides support for and electrical connections to the first FS 314 and second FS 315. Finally, a processor 316 is provided and makes electrical connections to the first FS 314 and second FS 315.

FIG. 4 is a flowchart illustrating a method 400 of measuring a change in resonant frequency of an oscillator according to a representative embodiment. The method can be implemented in the apparatuses 100, 300 or the thermometer 200 described in connection with representative embodiments above.

At 401 the method comprises scaling a first output signal from a first oscillator to provide a first output frequency from a first frequency synthesizer. At 402, the method comprises scaling a second output signal from a second oscillator to provide a second output frequency from a second frequency synthesizer. At 404 the method comprises mixing the first output frequency with the second output frequency to determine a difference frequency. At 405 the method comprises calculating a change of an output frequency of the first oscillator from the difference frequency to provide an indication of a change of a measurement parameter.

While representative embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method, comprising:
scaling a first output signal from a first oscillator to provide a first output frequency from a first frequency synthesizer, the first oscillator comprising a first resonator having a first resonant frequency, wherein the first resonant frequency is temperature dependent;
scaling a second output signal from a second oscillator to provide a second output frequency from a second frequency synthesizer, the second oscillator comprising a second resonator having a second resonant frequency, wherein the second resonant frequency is temperature dependent;
mixing the first output frequency with the second output frequency to determine a difference frequency;
determining a change of an output frequency of the first oscillator from the difference frequency; and
determining a change in a temperature from the output frequency.

2. The method of claim 1, wherein the difference frequency is at least four orders of magnitude less than the first output frequency and the second output frequency.

3. The method of claim 1, wherein the determining comprises:
measuring a period of an output signal after the mixing;
converting the period into the difference frequency; and
determining the change in the output frequency from the difference frequency.

4. An apparatus, comprising:
a first oscillator, the first oscillator comprising a first resonator having a first resonant frequency, wherein the first resonant frequency is temperature dependent;
a second oscillator, the second oscillator comprising a second resonator having a second resonant frequency, wherein the second resonant frequency is temperature dependent;
a first frequency synthesizer configured to receive a first input from the first oscillator and to provide a scaled first output frequency based on the first input;
a second frequency synthesizer configured to receive a second input from the second oscillator and to provide a scaled second output frequency based on the second input;
a mixer configured to receive the scaled first output frequency and the scaled second output frequency and to output a difference between the scaled first output frequency and the scaled second output frequency; and
a processor configured to determine a change in an output frequency of the first oscillator based on the difference, and to determine a temperature of the first resonator from the output frequency.

5. The apparatus of claim 4, wherein a frequency of the difference is at least four orders of magnitude less than the first output frequency and the second output frequency.

6. The apparatus of claim 4, wherein the first and second resonators are one of: a quartz resonator, a surface acoustic wave (SAW) resonator, and a bulk acoustic wave (BAW) resonator.

7. The apparatus of claim 4, wherein the processor is configured to measure a period of the output from the mixer, to convert the period into a difference frequency, and to determine the change in the output frequency of the first oscillator from the difference frequency.

8. The apparatus of claim 4, wherein the apparatus is included in a thermometer.

9. The apparatus of claim 4, wherein the apparatus is included in an infra-red imaging device.

10. An apparatus, comprising:
a first substrate comprising a reaction site;
a second substrate comprising a first resonator and a second resonator, wherein the first resonator is thermally coupled to the reaction site, the first oscillator comprising a first resonator having a first resonant frequency, wherein the first resonant frequency is temperature dependent, and the second oscillator comprising a second resonator having a second resonant frequency, wherein the second resonant frequency is temperature dependent;
a first oscillator including the first resonator and a second oscillator including the second oscillator;
a first frequency synthesizer configured to receive a first input from the first oscillator and to provide a scaled first output frequency based on the first input;
a second frequency synthesizer configured to receive a second input from the second oscillator and to provide a scaled second output frequency based on the second input;
a mixer configured to receive the scaled first output frequency and the scaled second output frequency and to output a difference between the scaled first output frequency and the scaled second output frequency; and
a processor configured to determine a change in an output frequency of the first oscillator based on the difference, and to determine a temperature from the output frequency of the first oscillator.

11. The apparatus of claim 10, wherein the first and second resonators are one of: a quartz resonator, a surface acoustic wave (SAW) resonator, and a bulk acoustic wave (BAW) resonator.

12. The apparatus of claim 10, wherein the processor is configured to measure a period of the output from the mixer, convert the period into a difference frequency, and determine the change in the output frequency of the first oscillator from the difference frequency.

* * * * *